(12) United States Patent
Nomura et al.

(10) Patent No.: US 6,790,293 B2
(45) Date of Patent: Sep. 14, 2004

(54) SOLDER WORK MATERIAL FOR FORMING SOLDER-COATED CIRCUIT BOARD AND CIRCUIT BOARD

(75) Inventors: Masahiro Nomura, Tokyo (JP); Toshiyuki Oga, Tokyo (JP); Takanobu Gido, Fukushima (JP); Takao Ono, Saitama (JP); Yoshiyuki Takahashi, Saitama (JP); Rika Sasaki, Aomori (JP)

(73) Assignees: NEC Corporation, Tokyo (JP); Tamurakaken Corporation, Saitama (JP)

( * ) Notice: Subject to any disclaimer, the term of this patent is extended or adjusted under 35 U.S.C. 154(b) by 0 days.

(21) Appl. No.: 10/147,171

(22) Filed: May 13, 2002

(65) Prior Publication Data

US 2002/0195170 A1 Dec. 26, 2002

(30) Foreign Application Priority Data

May 14, 2001 (JP) ........................... 2001-142830

(51) Int. Cl.[7] .................. B23K 35/363; B23K 35/365; B23K 35/368
(52) U.S. Cl. .......................................... 148/24
(58) Field of Search ..................... 148/24, 23

(56) References Cited

U.S. PATENT DOCUMENTS

| 4,243,440 A | | 1/1981 | Arbib et al. |
| 4,619,715 A | | 10/1986 | Hwang |
| 4,994,119 A | * | 2/1991 | Gutierrez et al. ............. 148/23 |
| 5,176,759 A | | 1/1993 | Taguchi |
| 5,863,355 A | * | 1/1999 | Ohno et al. .................... 148/26 |
| 5,871,592 A | | 2/1999 | Asagi et al. |
| 5,907,007 A | | 5/1999 | Ito et al. |
| 6,075,080 A | * | 6/2000 | Katsuoka et al. ............. 52/272 |
| 6,159,304 A | * | 12/2000 | Noguchi et al. .............. 148/23 |
| 6,474,536 B1 | * | 11/2002 | Kukanskis ................. 228/207 |

FOREIGN PATENT DOCUMENTS

| EP | 0443 030 A1 | 8/1991 |
| JP | 61 199598 | 9/1986 |
| JP | 03-047694 | 2/1991 |
| JP | 04 344888 | 5/1991 |
| JP | 09-186442 | 7/1997 |
| JP | 2001-150184 | 6/2001 |

* cited by examiner

*Primary Examiner*—Daniel Jenkins
(74) *Attorney, Agent, or Firm*—King & Schickli

(57) ABSTRACT

There is provided a solder work material for forming solder-coated circuit boards, which is capable of preventing the malfunction of circuit that may be caused to generate by voltage noises that tend to be generated by the volumetrical expansion of the flux residue in a soldered laminated ceramic capacitor, etc. even under the environments where temperatures fluctuate widely (for example, −40° C. to +85° C.), or that may be caused to generate by voltage noises to be generated by the fluctuation of parasitic capacity between circuits which may be caused to generate due to a flux residue. There is also provided a circuit board having a residual film of flux left thereon after the deposition of the solder work material. This solder work material is formed of a solder paste composition or a resin flux-cored solder, both comprising a flux containing, as a resin component, acrylic resin for preventing the generation of voltage noises in electronic devices. The circuit board is accompanied with a residual film of such a flux.

20 Claims, No Drawings

SOLDER WORK MATERIAL FOR FORMING SOLDER-COATED CIRCUIT BOARD AND CIRCUIT BOARD

TECHNICAL FIELD

The present invention relates to a solder work material constituted by either a solder paste composition or a resin flux-cored solder for use in soldering electronic devices on the surface of a circuit board, the solder work material being characterized in that the range of temperatures in which the solder work material can be employed without troubles is relatively wide (for example, in the range of −40° C. to +85° C.), and in that it can be employed in an outdoor telecommunication equipment having electronic devices, in particular, a ceramic capacitor, a film capacitor, etc. mounted thereon without giving rise to the generation of malfunctioning of circuit due to voltage noises. The present invention also relates to a circuit board having a residual film of flux left thereon after the deposition of the solder work material.

BACKGROUND OF THE INVENTION

An electronic devices-mounted circuit board which is generally employed in an electronic equipment is constructed such that electronic devices such as capacitors, resistors, etc. are electrically connected with each other and fixed to a printed circuit board by means of soldering.

In particular, if surface-mounting electronic devices are to be soldered to a printed circuit board, a reflow soldering method is employed, wherein a solder paste is coated at first on each of solder lands, an electronic chip is then mounted on each of solder lands, and the solder paste is heated to melt the solder particles of the solder paste, thus soldering the electronic chip thereon.

As for the solder paste, a paste-like composition comprising solder particles and a flux is generally employed. As for the materials for this flux, there has been generally employed a composition comprising rosin or a rosin-modified resin as a basic component; a little quantity of additives including an activator such as amine halogenosalt (such as amine hydrochloride) or an organic acid, a thixotropic agent such as cured castor oil, and other kinds of materials which are needed depending on the end-use and dissolved in a solvent, if required.

The rosins including rosin and a rosin-modified resin are generally excellent in electric insulating property, in humidity resistance, and in solderability, so that they have been employed as a flux for a long time. Therefore, the rosins including rosin and a rosin-modified resin are frequently employed as a resin component of a binder for solder paste. For this reason, a solder paste is generally manufactured by mixing solder particles with a flux comprising rosins.

By the way, the printed film of a solder paste which is designed to be formed on the soldering lands of a printed circuit board is heated in the process of reflow soldering process to thereby solder the electrodes of electronic devices onto the soldering lands. The residue of flux (hereinafter referred to also as flux residue) in the solder paste that will be separated on the occasion of the soldering is left remained between the soldered portions and the surface of the printed circuit board or between the soldered electronic devices and the surface of the printed circuit board. When a ceramic capacitor is employed in an electronic chip constituting the electronic devices, since the ceramic capacitor contains $BaTiO_3$ as a main component, voltage noises may be generated due to the piezoelectric effect that may be brought about as a mechanical pressure is applied to the ceramic capacitor. Further, because of the fact that the glass transition point of the resin in the conventional flux is fairly high (20–50° C.), the flux residue that has been left between the surface-mounted ceramic capacitors and the surface of the printed circuit board becomes hard and brittle as it is exposed to a cold environment of freezing temperature or lower, so that when the temperature of the resin is lowered to the glass transition temperature or less due to the cold environmental temperature, the volume of the flux residue is easily permitted to expand. Once the volume of the flux residue is expanded, it will lead to the generation of strain in a laminated ceramic capacitor element that has been mounted on the printed circuit board. Further, due to this strain, voltage noises are caused to generate, thereby giving rise to the malfunction of the circuit (circuit malfunction) that has been constructed by the incorporation of this ceramic capacitor element into the printed circuit board. Generally, there is a strong tendency in the case of ceramic electronic devices that voltage noises as mentioned above would be easily caused to generate. When ceramic electronic devices are employed in an outdoor electronic communication equipment, the aforementioned phenomenon of voltage noises is more likely to be generated due to an increased fluctuation of temperature thereof, thereby possibly raising a serious problem which may directly lead to communication troubles.

In recent years, due to an increasing tendency to further miniaturize and to further densify electronic devices, the circuit wirings is also increasingly densified, thus resulting in the miniaturization in pitch of soldering lands. As a result, the parasitic capacity due to the flux residue on the surface of printed circuit board is caused to increase, so that the voltage noises due to the fluctuation in volume of the flux residue tends to easily generate. Namely, this problem of voltage noises is more likely to be generated in a printed circuit board where the pitch of soldering lands is narrowed (not more than 0.3 mm), thereby frequently resulting in an increase in the scope of obstruction.

Therefore, with a view to minimize the influence of the residual film of flux, a washing treatment using a cleaning agent (water, an organic solvent, a surfactant, etc.) for washing the residual film of flux after the soldering has been performed on an electronic devices-mounting printed circuit board to be employed in an electronic equipment which is designed to be used even in a cold environment of freezing temperature or less. However, such a washing treatment necessitates a large quantity of water or organic solvents, thereby raising not only a problem in terms of protecting global environment but also a problem of increased manufacturing cost due to the provision of washing process. Further, since the performance of electronic devices tends to alter by the washing with the aforementioned cleaning agent, the washing treatment is technically restricted in that it cannot be applied to surface-mounting devices which are not suited for such a washing treatment.

With a view to overcome the aforementioned problems, it is now desired to develop a solder paste useful in reflow soldering, which is capable of preventing the volumetrical expansion of the residual film of flux even under a wide range of temperatures even if the residual film of flux is left remained on an electronic devices-mounting printed circuit board without performing the washing treatment.

The aforementioned desire is also applicable likewise to the "resin flux-cored solder", i.e. a solder work material which can be obtained by a process wherein a flux for resin flux-cored solder which has been thermally fused or dissolved in advance, is poured into a hollow body of soldering ground metal, which is then stretched by means of drawing machine until it becomes a wire of a predetermined diameter to thereby obtain the aimed solder (i.e. a cored solder whose axis is filled with the resin flux). By the way, this cored solder is generally employed for soldering electronic devices which are incapable of withstanding the heating temperature of reflow in the reflow soldering method onto a printed circuit board after other kinds of electronic devices have been reflow-soldered on the printed circuit board (post-soldering), or for post-soldering electronic devices which cannot be automatically mounted on the printed circuit board, or for correcting the failure of reflow soldering, if any.

BRIEF SUMMARY OF THE INVENTION

Therefore, a first object of the present invention is to provide a solder work material for forming solder-coated circuit boards, which is capable of preventing the malfunction of circuit that may be caused to generate by voltage noises that tend to be generated by the volumetrical expansion of the flux residue in a soldered laminated ceramic capacitor, etc. even under the environments where temperatures fluctuate widely (for example, −40° C. to +85° C.), or that may be caused to generate by voltage noises to be generated by the fluctuation of parasitic capacity between circuits which may be caused to generate due to a flux residue. A further object of the present invention is to provide a circuit board having a residual film of flux left thereon after the deposition of the solder work material.

A second object of the present invention is to provide a solder work material which can be manufactured in the same manner as in the case of the conventional paste containing rosins and which can be used in the same manner as the conventional circuit boards. A further object of the present invention is to provide a circuit board having a residual film of flux left thereon after the deposition of the solder work material.

A third object of the present invention is to provide a solder work material which makes it possible to obtain a residual film of non-wash type flux enabling the aforementioned first and second objects to be achieved. A further object of the present invention is to provide a circuit board having a residual film of flux left thereon after the deposition of the solder work material.

With a view to solve the aforementioned problems, the present invention provides: (1) a solder work material for forming solder-coated circuit boards, which is useful in soldering electronic devices onto a circuit board, and is constituted by either a solder paste composition or a resin flux-cored solder, both comprising solder particles and a flux containing at least a resin component; wherein said resin component comprises acrylic resin, and a rosin-based resin, and is useful in preventing the generation of voltage noises of electronic devices.

The present invention also provides: (2) a solder material for forming solder-coated circuit boards as set forth in the aforementioned item (1), wherein said resin component comprises 33 to 40% by weight of acrylic resin, and 12 to 18% by weight of a rosin-based resin.

The present invention further provides: (3) a solder work material for forming solder-coated circuit boards as set forth in the aforementioned item (1) or (2), wherein said acrylic resin is a copolymer comprising 10 to 20% of acrylic acid, 30 to 50% of acrylate, and 30 to 50% of methacrylate.

The present invention further provides (4) a solder work material for forming solder-coated circuit boards as set forth in the aforementioned item (1) or (2) or (3), wherein said acrylic resin is 4000 to 50000 in molecular weight; 25 to 400 in acid value; and −50° C. to −40° C. in glass transition temperature.

The present invention further provides (5) a circuit board having electronic devices mounted thereon and having a residual film of solder work material left thereon after a soldering process using the solder work material set forth in the aforementioned item (4).

The present invention further provides (6) a circuit board as set forth in the aforementioned item (5), wherein voltage noises to be generated by a strain of surface mounting electronic devices due to volumetrical expansion of the residual film of flux are prevented.

The present invention further provides (7) a circuit board as set forth in the aforementioned item (5), wherein voltage noises to be generated by the fluctuation of parasitic capacity among circuits due to volumetrical expansion of the residual film of flux are prevented.

The present invention further provides, in addition to the inventions set forth in the aforementioned items, "a solder paste composition for forming solder-coated circuit boards, which is useful in soldering electronic devices onto a circuit board, and is constituted by a solder paste comprising at least solder particles and a flux for solder paste; wherein said flux comprises at least a resin component and a solvent component, and said resin component comprises acrylic resin (or acrylic resin and rosin-based resin).". This invention may be further limited by any of the aforementioned items (2) to (7).

The aforementioned expression of "solder work material" may be replaced by other expressions such as "a solder paste composition for forming solder-coated circuit boards", "a solder paste composition for reflow soldering", or "a solder paste composition for forming reflow solder-coated circuit boards". Further, the aforementioned expression of "soldering method" may be replaced by an expression of "reflow-soldering method". The aforementioned expression of "is useful in preventing the generation of voltage noises of electronic devices" may be replaced by an expression of "is useful in preventing the generation of voltage noises of electronic devices through the inhibition of volumetrical expansion, under a low temperature, of flux residue after soldering".

DETAILED DESCRIPTION OF THE INVENTION

The flux to be employed in the solder work material of the present invention contains a resin component which, in turn, contains acrylic resin. By the expression of "acrylic resin", it means a resin comprising a polymer having, as a polymeric component, acrylic monomer. As for the definition of acrylic monomer, it includes those having an acidic group such as acrylic acid and methacrylic acid, and those having an ester group such as acrylate and methacrylate. It is also possible to employ a resin consisting of a polymer constituted by only acrylic monomer.

When the solder work material is constituted by a solder paste composition in the present invention, the acrylic resin should preferably be selected from those having a molecular weight falling within the range of 4000 to 50000 (as measured by way of GPC method (Gel Permeation Chromatography method)) in view of optimizing various factors such as the quantity of the resin in the solder paste flux, the viscosity of solder paste, the strength of the residual film of flux, the oxygen barrier properties of the residual film of flux after the soldering of solder paste, and the spreadability (wettability) of fused solder of solder paste over the soldering land of the printed circuit board containing rosins without the inclusion of acrylic resin. This limitation in molecular weight of acrylic resin is also applicable to the case where a resin flux-cored solder is employed.

Further, the glass transition temperature of acrylic resin is also important in order to obtain a residual film of flux which would be formed from a reflow soldering and would not volumetrically expand even if it is exposed to a cold environment of freezing point or less. More specifically, the glass transition temperature of acrylic resin should preferably be within the range of −50° C. to −40° C. in the case of a residual film of flux to be formed from a reflow soldering. Namely, if the glass transition temperature of acrylic resin is lower than this lower limit, the residual film of flux to be formed after the soldering using a solder paste or a resin-containing cored solder would become sticky. On the other hand, if the glass transition temperature of acrylic resin is higher than this upper limit, the residual film of flux would become poor in flexibility.

As for the polymerization method of acrylic resin as well as the control of molecular weight through the adjustment of the polymerization degree of acrylic resin, any of the conventional methods can be employed. Further, the glass transition point of acrylic resin can be adjusted, for example, by controlling the length of alcoholic group (hydroxyl group) of the ester of ester type monomer, or by controlling the polymerization ratio of the ester type monomer. This adjustment can be easily performed by making use of the known methods. For example, in view of the facts that the glass transition point of homopolymer of acrylic resin is 106° C., the glass transition point of homopolymer of ethyl acrylate is −22° C., and the glass transition point of homopolymer of butyl acrylate is −55° C., it is possible to adjust the glass transition point of homopolymer of acrylic resin by suitably copolymerizing monomers having these or other glass transition points.

As for the acid value of acrylic resin components to be employed in the present invention, it should preferably be within the range of 25 to 400. The solder paste comprising a flux containing acrylic resin and the resin-containing solder comprising a flux containing acrylic resin are easy in the manufacture as well as in handling thereof as in the case of the conventional solder paste and resin-containing solder both containing rosins, and are incapable of volumetrically expanding even under the freezing point thereof, so that they are more excellent as compared with the conventional solder paste and resin-containing solder.

In these respects, the acrylic resin constituting the flux to be employed in a solder paste or a resin-containing solder should preferably be comprised of a copolymer containing acrylic acid or acrylate as a main component, and a copolymerizable component selected from methacrylic monomer, methacrylate monomer and vinyl monomers. More preferably, the acrylic resin should be comprised of a copolymer comprising 10 to 20% of acrylic acid, 30 to 50% of acrylate, and 30 to 50% of methacrylate.

According to the present invention, the content of the aforementioned acrylic resin in the flux for the solder paste or resin flux-cored solder should preferably be within the range of 33–40% by weight (based on the total weight of flux). If the content of the acrylic resin is less than 33% by weight, it would become impossible to obtain the properties aimed at. On the other hand, if the content of the acrylic resin exceeds over 40% by weight, the residual film of flux to be formed after the reflow or soldering by way of soldering iron would become sticky.

The acrylic resin to be employed in the present invention may be used in combination with rosin-based resin as long as it does not give rise to the volumetric expansion of the residual film of flux. The rosin-based resin to be employed in this case includes rosin and rosin derivatives. Specific examples of the rosin and rosin derivatives include gum rosin, wood rosin, polymerized rosin, phenol-modified rosin, and the derivatives thereof. The content of the rosin-based resin should preferably be not more than 50% by weight based on the acrylic resin. If the content of the rosin-based resin is more than 50% by weight based on the acrylic resin, the residual film of flux to be formed after the soldering of solder paste or resin-containing solder would become too poor in flexibility.

According to the present invention, the flux for the solder paste or resin flux-cored solder may contain an activating agent such as amine salts (inorganic acid salts or organic acid salts) such as halogenated hydrogen salts of organic amine, organic acid salts, and organic amine salts. More specific examples of the activating agent include diphenyl guanidine hydrobromate, cyclohexyl amine hydrobromate, diethyl amine hydrochloride, malonic acid, succinic acid, adipic acid, sebacic acid, etc. The content of the activating agent in the flux should preferably be within the range of 0.1 to 5% by weight based on the flux in view of preventing the corrosion resistance and insulation resistance to be effected by the residual film of flux from being damaged as well as in view of preventing the solderability of solder from being deteriorated and also preventing a solder ball from being generated.

The solder paste according to the present invention comprises at least solder particles in addition to the aforementioned acrylic acid or a solder paste flux containing the aforementioned acrylic acid. As for the solder particles, it is possible to employ either lead-containing solder particles or lead-free solder particles. In this case, the ratio of the flux based on a total weight of the solder particles and the flux should preferably be within the range of 9 to 60% by weight. In the case of the resin flux-cored solder, the ratio of the flux based on a total weight of the solder and the flux should preferably be within the range of 0.5 to 10% by weight, more preferably 1 to 5% by weight.

As for the lead-free solder particles, it is possible to employ Sn/Ag, Sn/Ag/Cu, Sn/Ag/Cu/Bi, Sn/Sb, etc.

The solder paste according to the present invention can be manufactured by mixing the aforementioned solder paste flux with the solder. However, it is also possible to incorporate, in addition to the solder paste flux and the solder, a solvent selected from a glycol ether type solvent, an alcohol type solvent, an aromatic type solvent, an ester type solvent, etc., an activating agent, a thixotropic agent, a precipitation/separation preventive agent, and other kinds of additives, if required, into the paste, the resultant mixture being subsequently fully stirred to obtain the solder paste. The resin flux-cored solder according to the present invention can be manufactured by pouring the aforementioned resin flux which has been thermally fused or dissolved in advance into a hollow body of soldering ground metal that has been manufactured according to a conventional method.

In the solder paste according to the present invention, the solder particles are fused as they are heated to a reflow heating temperature, thereby enabling the electrodes of electronic chip to be electrically connected with the soldering land of printed circuit board. Further, in the case of the resin flux-cored solder, the solder is fused as it is heated by a soldering iron, thereby enabling the electrodes of electronic chip to be electrically connected with the soldering land of printed circuit board.

It is possible, in this manner, to obtain a printed circuit board on which electronic devices are soldered. In this case, even if the residual film of flux is not washed in the present invention, the residual film of acrylic resin is tenacious as compared with the film of rosins, and the degree of tenacity thereof can be suitably modified by changing the molecular weight of the acrylic resin. Therefore, the degree of tenacity of the residual film can suitably be selected from a wide range so as to ensure a sufficient flexibility of the residual film of flux even under a cold environment of the freezing thereof, thus making it possible to prevent the generation of malfunction of circuit that may be caused due to the voltage noises of laminated ceramic capacitor, etc.

The solder paste according to the present invention can be employed as follows. Namely, after a circuit wiring pattern has been formed through an etching treatment of a copper-clad laminate, or after the wiring pattern is further subjected to a soft etching treatment so as to remove copper oxide formed on the surface of the wiring pattern, the solder paste is printed on the surface of the printed circuit board having the aforementioned pattern formed thereon, thereby enabling the printed solder paste to be employed as a protective film for preventing the aforementioned pattern from being oxidized until the soldering step, thus providing a protective film-attached printed circuit board. Further, there is also provided a circuit board having a residual film of solder flux left thereon after the reflow soldering or after the soldering of the resin flux-cored solder.

(Prefrable Embodiments)

Next, the examples of the present invention will be explained as follows.

The solder paste of the present invention can be manufactured and employed in the same manner as the conventional solder paste, thereby forming a printed film of solder paste on the surface of printed circuit board, which is followed by a soldering process by way of reflow soldering. The following examples illustrate a method of forming a reflow solder-coated circuit board by making use of solder pastes according to the present invention.

EXAMPLE 1

First of all, acrylic resin for using in this example was manufactured as follows by making use of the following composition.

| | |
|---|---|
| Acrylic resin | 20% |
| Isopropyl acrylate (acrylate) | 40% |
| n-octyl methacrylate (methacrylate) | 40% |

The acrylic resin consisting of a copolymer thus obtained was 10000 in molecular weight (GPC method), 100 in acid value, and $-36°$ C. in glass transition temperature (the glass transition temperature of this copolymer was calculated according to a calculation formula of: $1/Tg = W_1/Tg_1 + W_2/Tg_2 + \cdots + W_n/Tg_n$ (wherein Tg is the glass transition temperature (absolute temperature) of the copolymer; $Tg_1 - Tg_n$ respectively shows the glass transition temperature of the homopolymer of each monomer; and $W_1 - W_n$ respectively represent a partial mass ratio of each monomer)).

Next, according to the following mixing ratios, butyl carbitol was placed in a vessel, into which the acrylic resin obtained as described above and hydrogenated rosin were incorporated and stirred to obtain a mixture, to which diphenyl guanidine hydrobromate as an activating agent and cured castor oil as a thixotropic agent were added under heating, the resultant mixture being subsequently fully stirred to obtain a homogeneous mixture and allowed to cool.

| | |
|---|---|
| The acrylic resin | 41.0% |
| Hydrogenated rosin | 10.0% |
| Diphenyl guanidine hydrobromate | 1.5% |
| Cured castor oil | 7.0% |
| Butyl carbitol | 40.5% |
| Total | 100.0% |

The solder paste flux thus obtained was then mixed with eutectic solder particles of Sn63/Pb37 at ratio of 10% to 90%, respectively to obtain a mixture which was then kneaded for one hour to obtain a solder paste. Then, by making use of this solder paste, the following tests were performed.

Comparative Example

A solder paste was manufactured by repeating the same procedures as explained in Example 1 except that a conventional solder paste which contained, as a resin component, only hydrogenated rosin without including acrylic resin was employed.

EXAMPLE 2

By making use of the solder pastes of the aforementioned Example 1 and Comparative Example and by way of a reflow soldering method, surface mount circuit boards were prepared by mounting thereon circuit network-constituting components including a VCO (voltage controlled oscillator) which is an important device constituting a portion of high-frequency circuits, a diode and a capacitor. The resultant circuit boards were then subjected to an experiment for examining the malfunction of the circuit network, wherein each of circuit boards was placed under an environment where the temperature thereof was fluctuated from $-33°$ C. to $+70°$ C. (one cycle of heating the circuit board from $-33°$ C. up to $+70°$ C. and again cooling the circuit board down from $+70°$ C. to $-33°$ C. was repeated six times).

Followings are the results of evaluation obtained from 28 samples of the surface mount circuit boards (samples of high-frequency circuit) that had been obtained by making use of each of the solder pastes of the aforementioned Comparative Example and Example 1.

28 samples of Comparative Example:
    All generated malfunction of circuit within two cycles.
28 samples of Example:
    All generated no malfunction of circuit within throughout six cycles.

By the way, in a severe test for evaluating the reliability of the circuit board, the aforementioned temperature fluctuation cycle is usually repeated three times at most.

It will be understood from the above results that the circuit boards manufactured by making use of the solder paste of Example 1 are capable of exhibiting an excellent reliability corresponding to 100% as far as the circuit malfunction test of a high-frequency circuit network is concerned.

By the way, with respect to the resin flux-cored solder which can be obtained by thermally melting the solid matter of the flux and pouring the resultant fused flux into a hollow ground metal of solder, it was found possible, through the experiment which was similar to the aforementioned experiment, to obtain almost the same results.

According to the present invention, it is possible, even if the residual film of flux formed through the reflow soldering or through the soldering using a resin flux-cored solder is exposed to an environment of wide temperature fluctuations (for example, −40° C. to +85° C.), to keep an excellent flexibility thereof and to prevent the resin component incorporated in the residual flux from being cooled lower than the glass transition temperature. As a result, it is possible to inhibit the volumetric expansion of the residual flux and to prevent the generation of fluctuation of parasitic capacity among the circuits. Therefore, it is possible, not only in a ceramic electronic device but also even in an electronic device which is usually vulnerable to a thermal or physical shock to thereby generate voltage noises, to prevent the generation of malfunction of circuit even under an environment of wide range of temperature fluctuation.

Moreover, it is possible to provide a solder paste or a resin flux-cored solder for forming a solder-coated circuit board, or a circuit board having a residual flux film left thereon after a soldering process, all of which can be manufactured and employed in the same manner as in the case of the conventional counterparts which are formed using rosins. Furthermore, since it is possible to prevent the aforementioned volumetrical expansion of the residual film, the washing step of the residual film can be dispensed with, thus leading to the saving of manufacturing cost and to prominent contribution to the environmental protection. A most prominent technical contribution of the present invention is the fact that there is no restriction in designing a circuit with respect to the devices to be mounted thereon (such as the selection of devices to be mounted and the mounting conditions thereof), so that even the surface mount electronic devices or lead components, to which an ordinary washing process is not applicable, can be mounted on the circuit board.

The residual flux film to be formed from the solder paste or resin flux-cored solder according to the present invention is excellent in solderability and in preventing the corrosion of soldering lands, so that the residual flux film is also useful as a protective film for the soldering lands of the printed circuit board, thus making it possible to provide a protective film-attached printed circuit board having electronic devices mounted thereon and having the almost the same function as that of conventional printed circuit board.

What is claimed is:

1. A solder work material for forming solder-coated circuit boards, which is useful in soldering electronic devices onto a circuit board, and is constituted by either a solder paste composition or a resin flux-cored solder, both comprising solder particles and a flux containing at least a ream component; wherein said resin component comprises 33 to 40% by weight of an acrylic resin copolymer, and a rosin-based resin, and is useful in preventing the generation of voltage noises of electronic devices.

2. The solder work material according to claim 1, wherein said resin component comprises 12 to 18% by weight of a rosin-based resin.

3. The solder work material according to claim 1, wherein said acrylic resin is a copolymer comprising 10 to 20% of acrylic acid, 30 to 50% of acrylate, and 30 to 50% of methacrylate.

4. The solder work material according to claim 2, wherein said acrylic resin is a copolymer comprising 10 to 20% of acrylic acid, 30 to 50% of acrylate, and 30 to 50% of methacrylate.

5. The solder work material according to claim 1, wherein said acrylic resin is 4000 to 50000 in molecular weight; 25 to 400 in acid value; and −50° C. to −40° C. in glass transition temperature.

6. The solder work material according to claim 2, wherein said acrylic resin is 4000 to 50000 in molecular weight; 25 to 400 in acid value; and in −50° C. to −40° C. in glass transition temperature.

7. The solder work material according to claim 3, wherein said acrylic resin is 4000 to 50000 in molecular weight; 25 to 400 in acid value; and −50° C. to −40° C. in glass transition temperature.

8. The solder work material according to claim 4, wherein said acrylic resin is 4000 to 50000 in molecular weight; 25 to 400 in acid value; and −50° C. to −40° C. in glass transition temperature.

9. A circuit board having electronic devices mounted thereon and having a residual film of solder work material left thereon after a soldering process using the solder work material claimed in claim 5.

10. A circuit board having electronic devices mounted thereon and having a residual film of solder work material left thereon after a soldering process using the solder work material claimed in claim 6.

11. A circuit board having electronic devices mounted thereon and having a residual film of solder work material left thereon after a soldering process using the solder work material claimed in claim 7.

12. A circuit board having electronic devices mounted thereon and having a residual film of solder work material left thereon alter a soldering process using the solder work material claimed in claim 8.

13. The circuit board according to claim 9, wherein voltage noises to be generated by a strain of surface mounting electronic devices due to volumetrical expansion of the residual film of flux are prevented.

14. The circuit board according to claim 10, wherein voltage noises to be generated by a strain of surface mounting electronic devices due to volumetrical expansion of the residual film of flux are prevented.

15. The circuit board according to claim 11, wherein voltage noises to be generated by a strain of surface mounting electronic devices due to volumetrical expansion of the residual film of flux are prevented.

16. The circuit board according to claim 12, wherein voltage noises to be generated by a strain of surface mounting electronic devices due to volumetrical expansion of the residual film of flux are prevented.

17. The circuit board according to claim 9, wherein voltage noises to be generated by the fluctuation of parasitic capacity among circuits due to volumetrical expansion of the residual film of flux are prevented.

18. The circuit board according to claim 10, wherein voltage noises to be generated by the fluctuation of parasitic capacity among circuits due to volumetrical expansion of the residual film of flux are prevented.

19. The circuit board according to claim 11, wherein voltage noises to be generated by the fluctuation of parasitic capacity among circuits due to volumetrical expansion of the residual film of flux are prevented.

20. The circuit board according to claim 12, wherein voltage noises to be generated by the fluctuation of parasitic capacity among circuits due to volumetrical expansion of the residual film of flux are prevented.

* * * * *